United States Patent [19]

Hoffmann

[11] 4,075,515

[45] Feb. 21, 1978

[54] DIGITAL DIFFERENTIAL AMPLIFIER FOR CCD ARRANGEMENTS

[75] Inventor: Kurt Hoffmann, Taufkirchen, Germany

[73] Assignee: Siemens Aktiengesellschaft, Berlin & Munich, Germany

[21] Appl. No.: 717,690

[22] Filed: Aug. 25, 1976

[30] Foreign Application Priority Data

Sept. 18, 1975 Germany .................. 2541721

[51] Int. Cl.² ............... H03K 5/18; H03K 5/02; H01L 29/78
[52] U.S. Cl. .................. 307/362; 307/200 B; 307/221 D; 307/264; 307/DIG. 3; 307/279
[58] Field of Search ............ 307/221 D, 264, 350, 307/352, 353, 354, 362, 363, 304, DIG. 1, DIG. 3, 279, 200 B; 357/24

[56] References Cited

U.S. PATENT DOCUMENTS

| | | | |
|---|---|---|---|
| 3,758,794 | 9/1973 | Kosonocky | 357/24 X |
| 3,814,955 | 6/1974 | Itoh et al. | 307/221 D X |
| 3,826,926 | 7/1974 | White et al. | 307/221 D |
| 3,944,990 | 3/1976 | Chou | 357/24 X |
| 3,949,245 | 4/1976 | Emmons | 307/DIG. 3 X |
| 3,971,003 | 7/1976 | Kosonocky | 307/221 D X |
| 3,979,603 | 9/1976 | Gosney | 307/DIG. 3 X |
| 4,004,164 | 1/1977 | Cranford, Jr. et al. | 307/362 X |

OTHER PUBLICATIONS

Dennard, "Regeneration Circuit for CCD Shift Registers"; IBM Tech. Discl. Bull., vol. 14, No. 12, pp. 3791-3792; 5/1972.

Dennard et al, "Read/Write Amplifier for CCD Memory"; IBM Tech. Discl. Bull., vol. 14, No. 12, pp. 3722-3723; 5/1972.

*Primary Examiner*—Larry N. Anagnos
*Attorney, Agent, or Firm*—Hill, Gross, Simpson, Van Santen, Steadman, Chiara & Simpson

[57] ABSTRACT

Digital differential amplifier with pre-chargeable parasitic capacitances to switch on or hold blocked output transistors discharging or not discharging an output capacitance via a constant current sink for a combination of two charge coupled devices. The digital differential amplifier detects the presence or absence of charge on the output of a first charge coupled device and inputs a corresponding charge to a second charge coupled device. The combination of the two charge coupled devices with two digital differential amplifiers and two control transistors is such that stored charges may be recirculated between the two charge coupled devices or previously stored data may be serially read from the output of one charge coupled device and new data may be serially written into the input of the other charge coupled device. A method of recirculating previously stored data or writing new data into the second charge coupled device using precharged parasitic and diffusion zone capacitances is also described.

14 Claims, 10 Drawing Figures

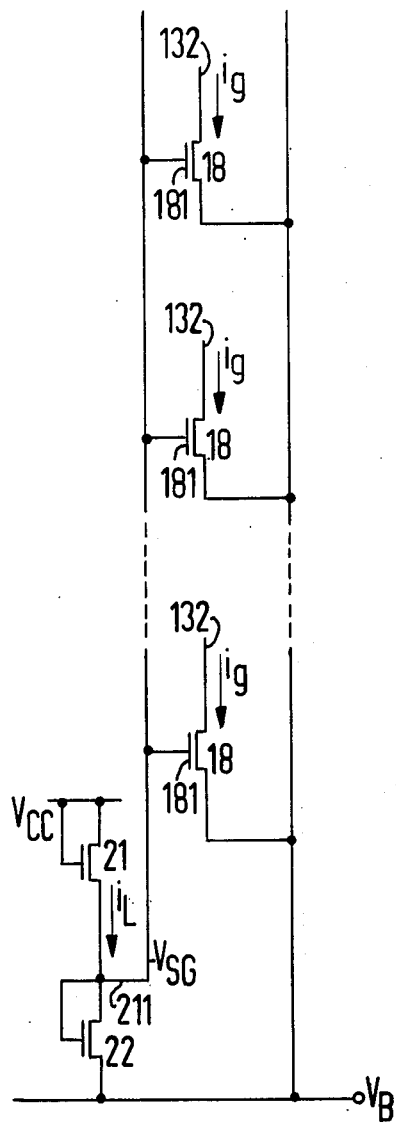
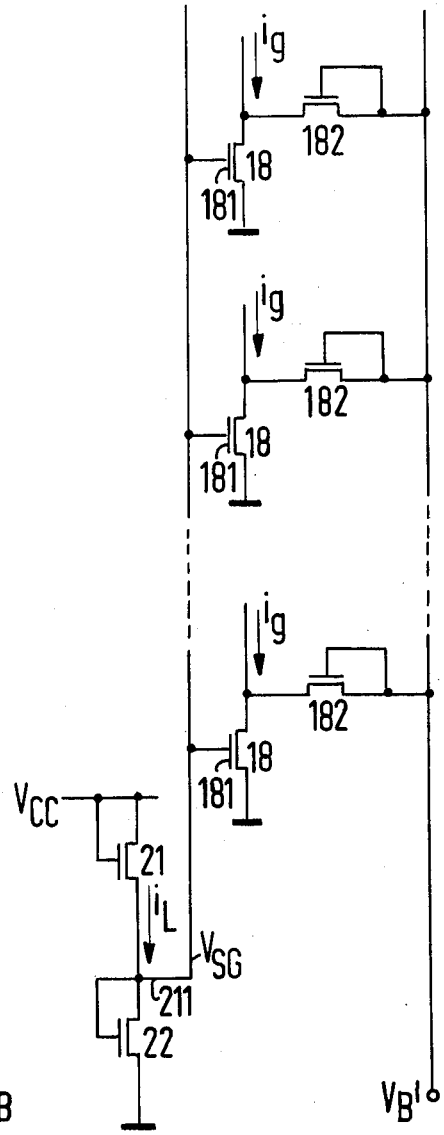

4,075,515

DIGITAL DIFFERENTIAL AMPLIFIER FOR CCD ARRANGEMENTS

BACKGROUND OF THE INVENTION

The invention relates to a digital differential amplifier for CCD arrangements.

In CCD circuits, it is necessary to regenerate the information after a specific number of transmissions to enable the original information to be retained, whereby these regenerator stages are subject to several requirements. On the one hand, they are to be independent of fluctuations in start voltage and in supply voltage. On the other hand, a reference voltage, which is required for the analysis of the input signal, is to be produced in the circuits themselves. The output amplitude of the regenerator stages is to be as high as possible. In addition, these regenerator stages are to facilitate the production of a determine basic charge in the CCD. Finally, they are to fit into the CCD pattern.

SUMMARY OF THE INVENTION

The object of the present invention is to provide a differential amplifier for CCD arrangements which fulfills the above mentioned requirements to the greatest extent possible.

This object is realized by a differential amplifier which is characterized by a first transistor which can be controlled at a gate terminal by a first control voltage with a first input connected to a first input terminal; a first capacitance having a first terminal connected to a first input terminal and a second terminal to a first terminal on a first voltage supply; a second transistor with a gate terminal connected with a first input terminal having a first input connected to a first circuit node and a second input connected to a first output terminal; a third transistor which can be controlled at a gate terminal by a second control voltage with a first input connected to a second terminal on a first power supply and a second input connected to a first circuit node; a fourth transistor with a gate terminal connected to a first circuit node, a first input connected to a second terminal on a first supply voltage and a second input connected to a first output terminal; a second capacitance having a first terminal connected to a first circuit node and a second terminal connected to a first terminal on a first supply voltage; a third capacitance having a first terminal connected to a first output terminal and a second terminal connected to a first terminal on a first supply voltage; a first current sink having a first terminal connected to a first output terminal and a second terminal connected to a first terminal of a second supply voltage.

Further details of the invention are given in the description and the Figures.

BRIEF DESCRIPTION OF THE DRAWINGS

FIG. 4 is the circuit diagram of current sinks for controlling the dynamic amplifiers in accordance with the invention;

FIG. 5 illustrates a circuit variant of the circuit of FIG. 4;

DESCRIPTION OF THE PREFERRED EMBODIMENTS

Figure 1:
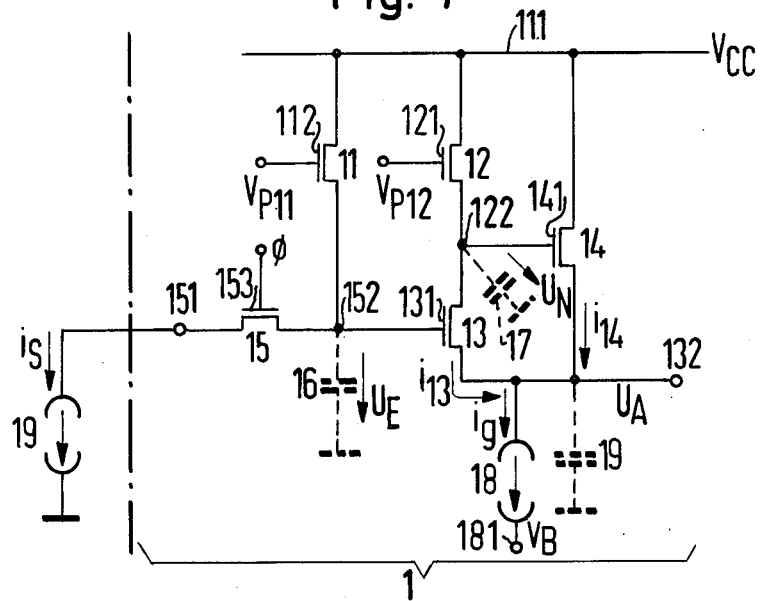
FIG. 1 is the circuit diagram of a digital differential amplifier in accordance with the invention.

The digital differential amplifier 1 in accordance with the invention shown in FIG. 1 basically consists of the transistors 11 to 15. Here the transistor 15 is connected on the one hand to the input 151 and on the other hand to a point 152. The transistor 15 can be controlled by the pulse train $\phi$ connected to its gate terminal 153. The transistor 11 is connected on the one hand to the point 152 and on the other hand to a line 111 to which the supply voltage $V_{CC}$ is connected. The transistor 11 can be controlled via its gate terminal 112 by the potential $V_{P11}$. The point 152 is likewise connected to the gate terminal 131 of the transistor 13. The said transistor is in turn connected on the one hand to the output 132 and on the other hand to the transistor 12. The transistor 12 is connected on the one hand to the transistor 13 and on the other hand to the line 111.

The transistor 12 is controlled via its gate terminal 121 by the potential $V_{P12}$. The gate terminal 141 of another transistor 14 is connected to the point 122, at which the transistors 12 and 13 are connected in series. The transistor 14 is connected on the one hand to the output 132 and on the other hand to the line 111.

The transistors 11 and 12 serve to bias the parasitic capacitances 16 and 17, while the transistors 13 and 14, together with a current sink 18, produce a reference voltage and amplify and input signal. Here the current sink 18 is connected to the output 132 on the one side and on the other side is connected to a terminal 181 which is connected with the voltage $V_B$. The transistor 15 connects the input 151 to the nodal point 152.

Figure 3:
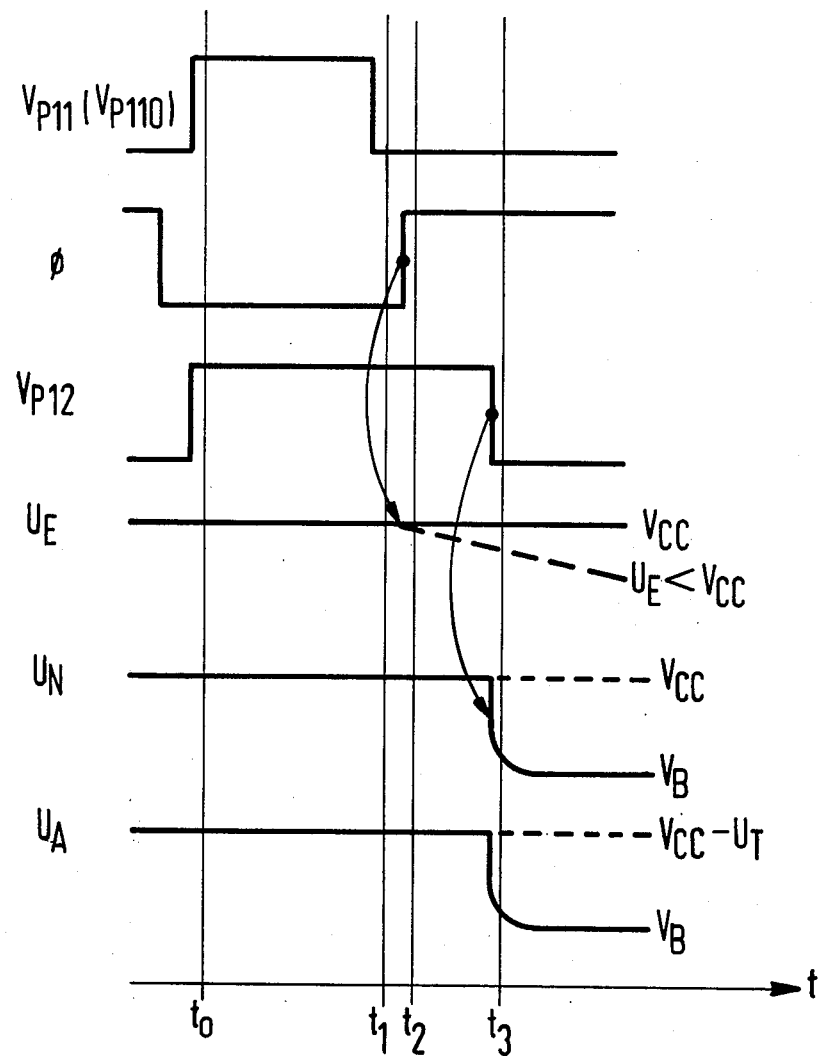
FIG. 3 shows the time diagram for the circuits corresponding to FIGS. 1 and 2.

In the following, the functioning of the circuit shown in FIG. 1 will now be described in association with FIG. 3. At the time $t_0$ the transistors 11 and 12 are switched on so that the parasitic capacitances 16 and 17 are charged to the voltage $V_{CC}$. When the transistors 13 and 14 possess the same geometric dimensions, the current which flows through them is $i_{13} = i_{14} \approx i_g/2$, where $i_g$ is the current flowing through the current sink 18.

Then a voltage of $U_A = V_{CC} - U_T$ is connected to the output 132 of the differential amplifier 1, where $U_T$ is the start voltage of the transistors 11 to 15. At the time $t_1$, the transistor 11 is switched off. This is achieved by disconnecting the potential $V_{P11}$ at the gate terminal 112. The voltage across the capacitor 16 does not thereby change and the current ratio $i_{13} = i_{14}$ remains. The input 151, as illustrated in FIG. 1, is connected to a current sink 19, at which the presence of the current $i_S$ corresponds to a binary "1", and the absence of the current $i_S = 0$ corresponds to a binary "0". When the transistor 15 is conductive, the capacitor 16 is thereby either discharged to the voltage $U_E < V_{CC}$ or else remains biased at the voltage $U_E = V_{CC}$. As a result, the output 132 can assume two different states at the time $t_3$.

a. When $U_E < V_{CC}$, the transistor 13 is disconnected, as the voltage between its gate terminal and its source terminal is $U_E - U_A < U_T$. The voltage $U_N$ across the capacitance 17 remains, unchanged, at $U_N = V_{CC}$ and thus the output voltage $U_A = V_{CC} - U_T$ remains at the output 132 of the amplifier.

b. If $U_E = V_{CC}$, the transistor 13 remains switched on, as a result of which the gate and the source terminal of the transistor 14 are connected to one another. This results in the transistor 14 being switched off, and the current sink 18 discharging the output 132 in the direction $V_B$.

The two states a. and b. are conditional upon the transistor 12 being blocked.

As the output voltage $U_A$ is dependent only upon the ratio of the voltages $U_N$ to $U_E$ across the capacitances 16 and 17, where $U_A = V_{CC} - U_T$, when $U_E < U_N$ and $U_A = V_B$ when $U_E = U_N$, fluctuations in supply voltage and start voltage have no influence on the amplification process.

Figure 2:
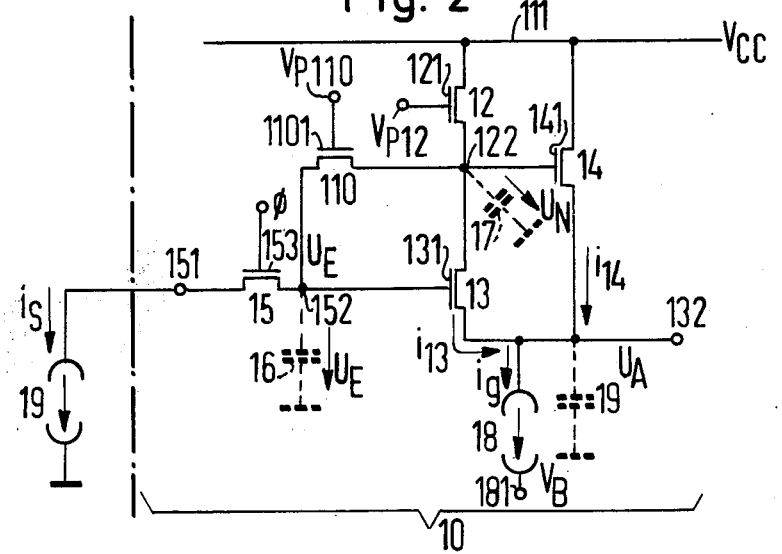
FIG. 2 shows a circuit variant of FIG. 1.

FIG. 2 illustrates a circuit variant 10 to the digital differential amplifier 1 from FIG. 1. Here details of FIG. 2 are provided with the corresponding references already described in association with FIG. 1. The transistor 110, which corresponds to the transistor 11 in FIG. 1, is not, as in FIG. 1, connected on the one hand to the point 112 and on the other hand to the line 111. Instead the transistor 110 is connected on the one hand to the point 152 and on the other hand to the modal point 122. This has the advantage that the voltage drop which occurs across the transistor 12, when the capacitance 17 is biased, acts upon the capacitance 16 to the same extent. As a result, differences in voltage across the two capacitances 16 and 17 are advantageously avoided.

FIG. 4 illustrates current sinks 18 required for a plurality of different amplifiers in accordance with the invention. A voltage divider which consists of the transistors 21 and 22, which latter are connected in series as load elements and between which the voltage $V_{CC} - U_B$ is connected, produces, on a line 211, a voltage $V_{SG}$ which determines the current flow through the current sinks 18. The current sinks 18 each consist of transistors which on the one hand are connected to the potential $V_B$ and on the other hand to the output of a differential amplifier in accordance with the invention (FIGS. 1 and 2). The gate terminal 181 of each current sink 18 is connected to the line 211. Fluctuations in start voltage in the current sinks have scarcely any influence on the current $i_S$ flowing through them, as the voltage $V_{SG}$ is changed to the same extent. The current sinks 18 are in a position to discharge the output capacitors 19 of the differential amplifiers 1, 10 to the potential $V_B$. At the end of the discharge, the current sinks 18 pass into the linear range as a result of which the discharge proceeds only very slowly.

Therefore, in the circuit variant illustrated in FIG. 5, the current sinks 18 are connected in the manner shown in FIG. 4 to the transistors 182 which are connected as load elements and which avoid the current sinks 18 from passing into the linear range. The voltage to which the output capacitances 19 of the differential amplifiers 1, 10 can be discharged, is here determined by the voltage $V_B$. Details of FIG. 5, which have already been described in association with FIG. 4, bear the corresponding references.

The output voltage $U_A$ can also be limited by ensuring that the pulse train voltage $V_{P12}$ is not pulsed under a voltage of $U_{BB}$. As a result, the output 132 of the amplifier cannot fall below a voltage of $U_{BB} - 2U_T$.

Figure 6:
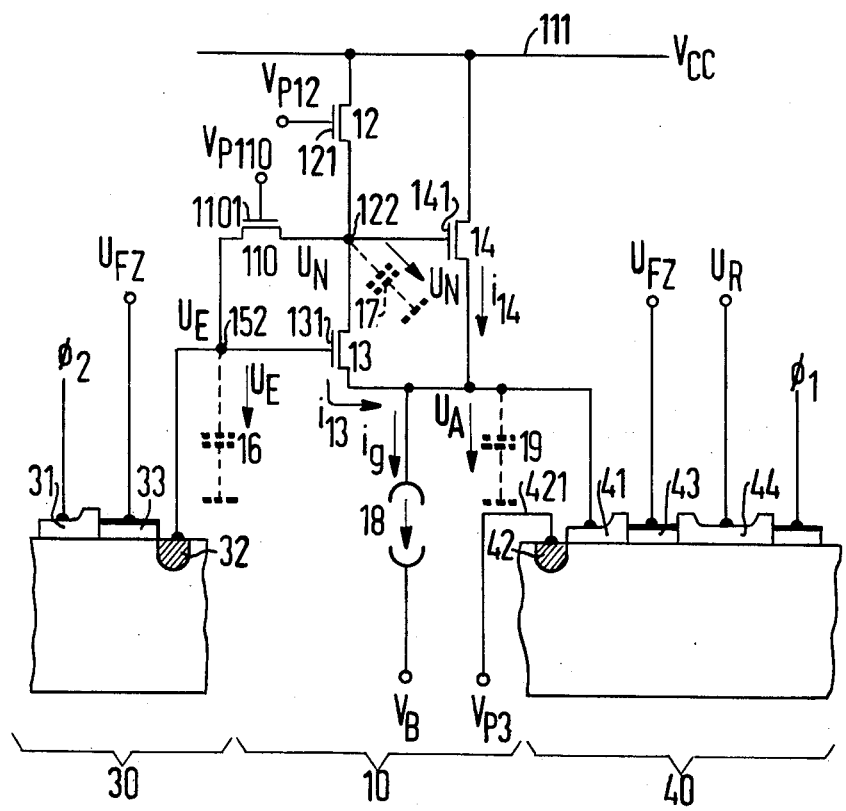
FIG. 6 schematically illustrates the arrangement of a differential amplifier in accordance with the invention between a CCD output stage and a CCD input stage.

FIG. 6 illustrates a CCD regenerator stage in which the differential amplifier 10 in accordance with the invention illustrated in FIG. 2 is connected between the output and the input of a CCD shift register. Details of FIG. 6 which have already been described in association with the other Figures bear the corresponding references. The output CCD stage of a first CCD is referenced 30 and the input CCD stage of a second CCD is referenced 40. The last electrode 31 of the output CCD 30 here assumes the function of the transistor 15, and that of the current sink 19 shown in FIGS. 1 and 2. The output diffusion zone 32 of the output stage 30 is connected to the node 152 of the differential amplifier 10. The output 132 of the differential amplifier 10 is connected to the input electrode 41 of the input stage 40.

Figure 7:
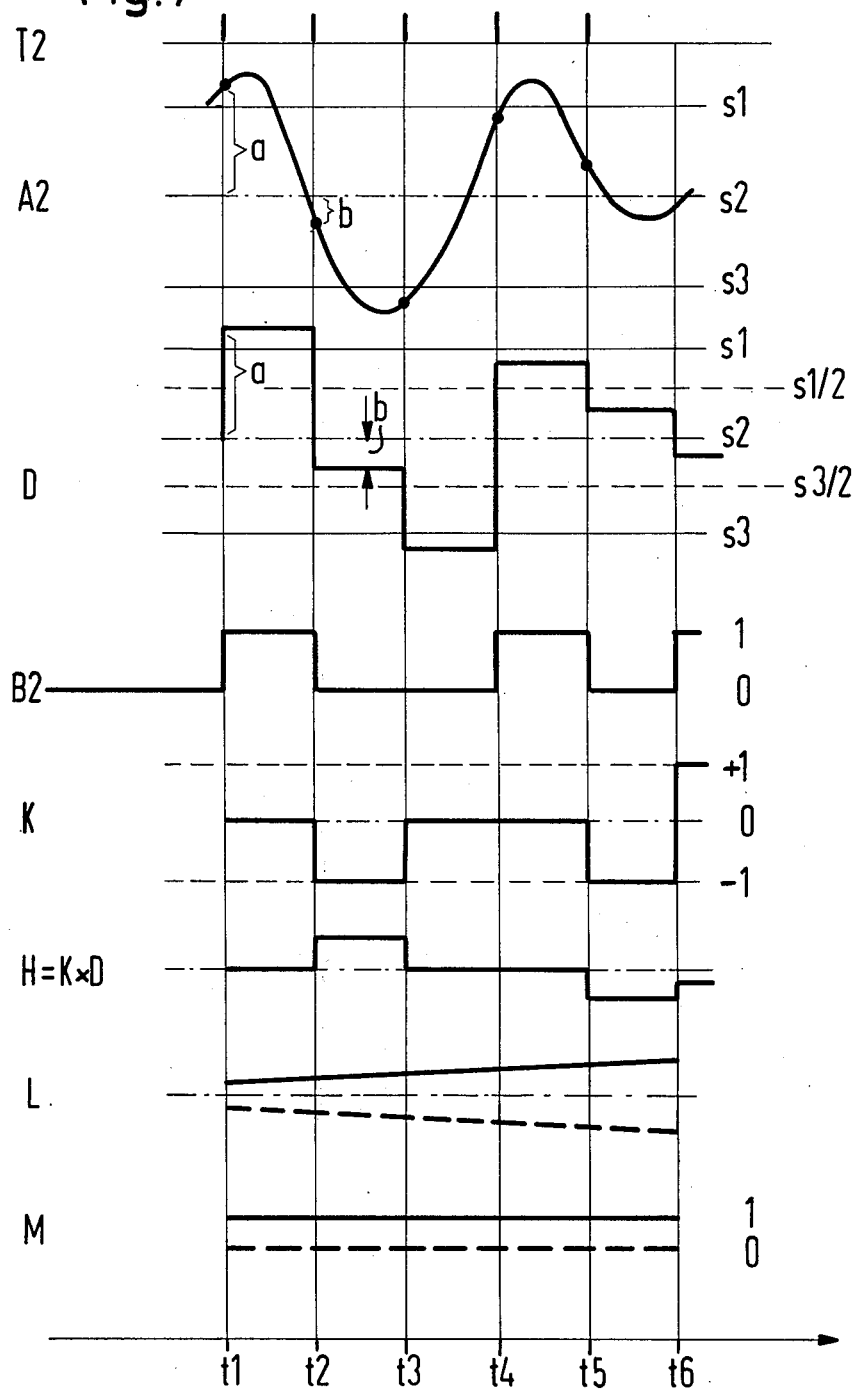
FIG. 7 is the time diagram relating to the arrangement shown in FIG. 6.
Figure 8:
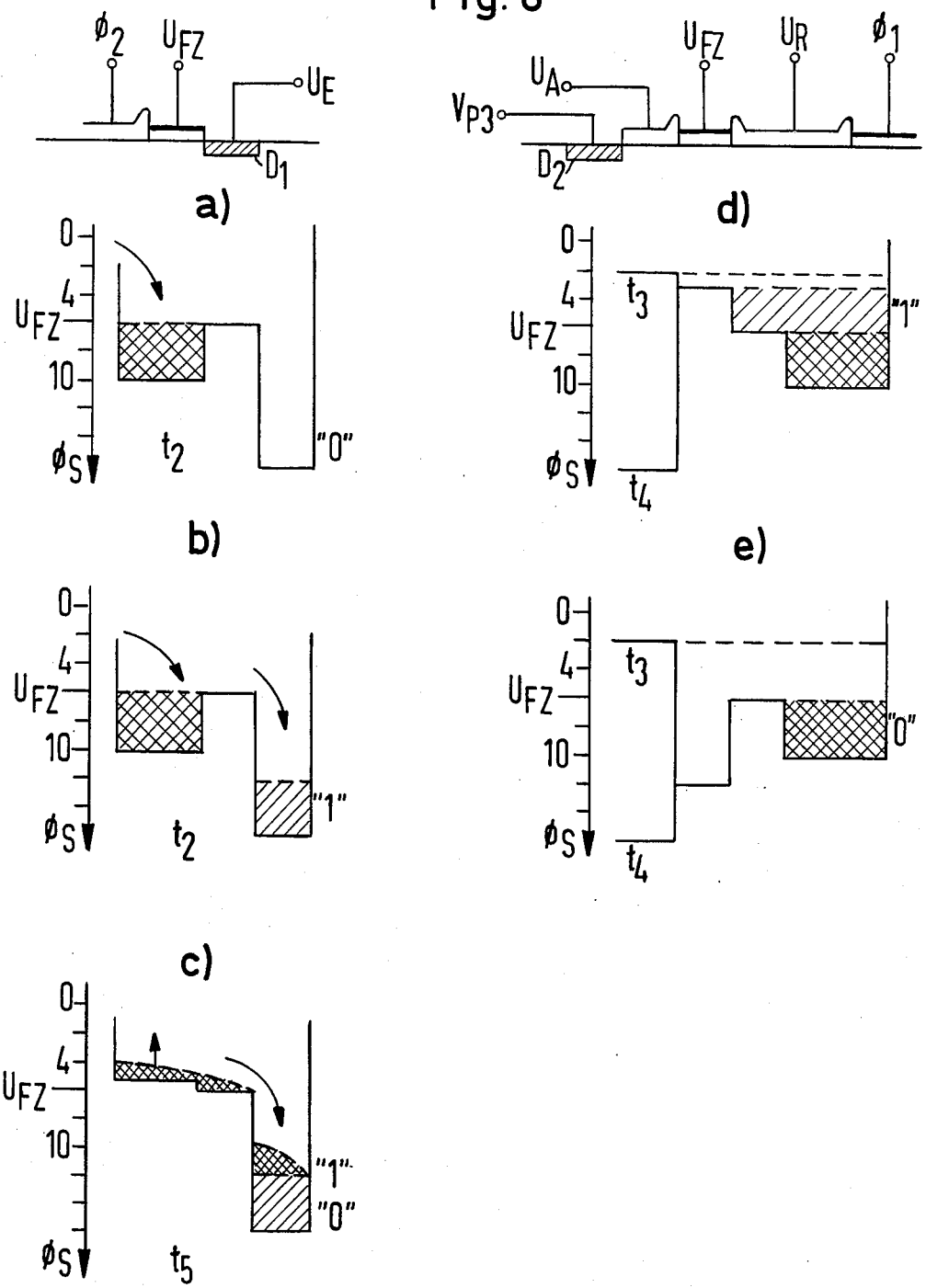
FIG. 8 shows the potential well model for the output stage and for the input stage corresponding to FIG. 6.

In the following, the function of the arrangement shown in FIG. 6 will now be described in association with the time diagram of FIG. 7.

At the time $t_0$, the capacitances 16 and 17 are biased to the voltage $V_{CC}$. For this purpose, again the transistors 110 and 12 are brought into the conductive state. When the transistor 110 has been switched off at the time $t_1$, a voltage $\phi_2$ is connected to the CCD electrode 31 of the output stage 30. If electrons representing a binary "1" here reach the output diffusion zone 32 of the output circuit 30, the parasitic capacitance 16 which is composed of the capacitance of the diffusion zone 32 and the parasitic capacitances of the transistors 110 and 13, are discharged. At the time $t_2$, a voltage of $U_E < V_{CC}$ occurs at the nodal point 152, as a result of which the output voltage $U_A = V_{CC} - U_T$ remains unchanged (time $t_3$).

If, on the other hand, at the time $t_2$ no electrons reach the output zone 32, which corresponds to a binary "0", the voltage $U_E = V_{CC}$ remains unchanged, and the current sink 18 discharges the output capacitance 19 to the voltage $V_B$ at the time $t_3$.

As described in the publications "Use of Charge-Coupled Devices for Delaying Analog Signals", IEEE Journal of Solid-State Circuits, SC-8, No. 2, April 1973 and "Measurements of Noise in Charge-Coupled Devices", J. E. Carnes, W. F. Kosonocky and P. A. Levine, RCA Review, 34, p. 553 - 565 Dec. 1973, the electrons present at the input of the input stage 40 are injected, through the pulsing of the diffusion zone 42, into the potential wells which lie under the gate electrodes 43 and 44 with the potentials $U_{FZ}$ and $U_R$. The surface potentials which are thus produced are illustrated in FIGS. 8a to 8e. At the time $t_3$, the diffusion zone 42 has a voltage of, e.g., 2 V, so that the entire potential well is filled with electrons. It the signal $U_A = V_B$ is connected to the control electrode 41, which corresponds to a binary "0" at the input, beneath the electrode 41 a surface potential is set up (FIG. 8d) which determines the discharge of the potential well at the time $t_4$. At this time, the diffusion zone 42 was switched positive, e.g. to 16 V, as a result of which sufficient electrons flow out of the entire potential well to the diffusion zone 42, for the surface potential of said diffusion zone to equal that of the electrode 41 with the voltage $U_A = V_B$. The quantity of charge which is thereby stored corresponds to a binary "1". If a voltage of $U_A = V_{CC} - U_T$ is connected to the control electrode (FIG. 8e), under this electrode there prevails a surface potential of sufficient magnitude to ensure that the discharge of the electrons at the time $t_4$ is determined by the surface potential $\phi_{FZ}$ under the electrode 43 with the voltage $U_{FZ}$. The quantity of charge remaining in the potential well beneath the electrode 44 with the voltage $U_R$ here corresponds to a binary "0" (fat zero).

The regenerating amplifier 1, 10 described in the aforegoing is in a position to discover the presence or absence of charge at the output of the output-CCD 30. As the binary states are represented by different quantities of charge in the CCD, the output stage 30 of the CCD must convert the different quantity of charge into the existence or absence of charge. This is effected, as shown in FIGS. 8a to 8c by the electrode 33 with the gate voltage $U_{FZ}$. Under this electrode prevails a surface potential $\phi_{FZ}$, which is of the same magnitude as that of the electrode 43 at the input of the CCD stage 40. If, at the time $t_2$, the quantity of charge corresponding to a binary "0" passes into the potential well under the electrode 31 with the gate voltage $\phi_2$, the surface potential $\phi_{FZ}$ prevents electrons from charging the diffusion zone 32. If, on the other hand, a binary "1" reaches the output, the potential well beneath the electrode 31 overflows and electrons charge the diffusion zone 32 (FIG. 8b). At the time $t_5$, the gate voltage $\phi_2$ is disconnected, as a result of which those electrons still located beneath the electrode 31 are discharged via the diffusion zone 32 (FIG. 8c). The output stage is thus prepared for the following read-out process.

Figure 9:
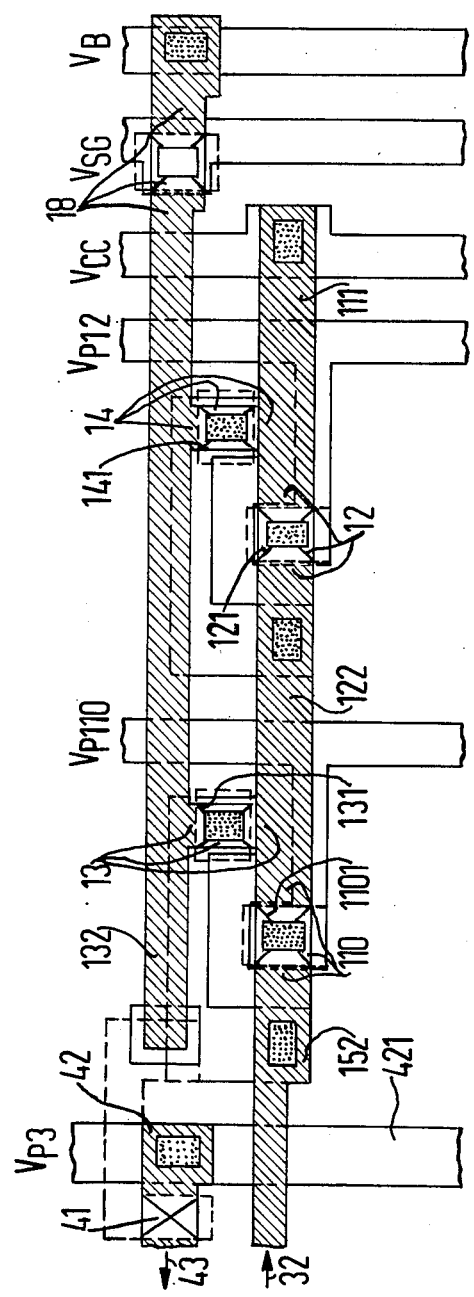
FIG. 9 shows the embodiment of a circuit corresponding to FIG. 6.

FIG. 9 illustrates the lay-out of a circuit in accordance with the invention corresponding to FIG. 6. Here non-shaded areas bordered by solid lines represent aluminum conductor paths and electrodes. Shaded areas represent diffusion zones, non-shaded areas bordened by broken lines represent polysilicon, dotted areas represent contact holes and areas crossed by diagonals between shaded areas represent silicon gate electrodes. Details of FIG. 8 which have already been described in association with other Figures bear the corresponding references.

Figure 10:
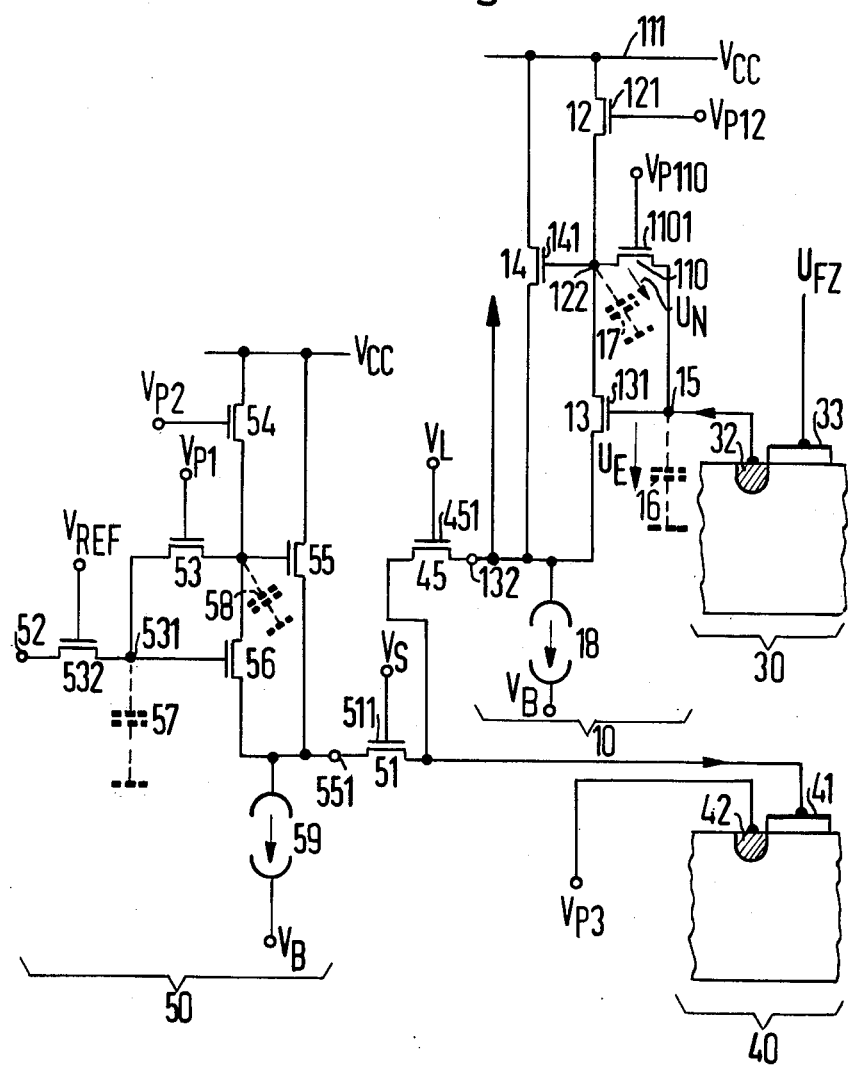
FIG. 10 shows a CCD loop with a read-write circuit.

FIG. 10 illustrates a write-read circuit. Details of FIG. 10 which have already been explained in association with the other Figures, have been referenced accordingly. The CCD input stage 40 is connected via the transistor 45 and via the regenerator stage 10 to the output diffusion zone 32 of the output-CCD stage 30. Also, the CCD input stage 40 is connected via the transistor 51 and via the input amplifier 50 to the data input 52. The transistor 45 can be operated by the potential $V_L$ which is connectable to its gate terminal 451, and the transistor 51 can be operated by the potentiao $V_S$ which is connectable to the gate terminal 511. The input amplifier 50 is preferably constructed in the same way as the amplifiers in accordance with the invention. In the circuit shown in FIG. 10, the amplifier 50 possesses the same construction as the amplifier 10. Here, the transistor 53 of the amplifier 50 corresponds to the transistor 110 of the amplifier 10. Similarly, the transistor 54 corresponds to the transistor 12, the transistor 55 corresponds to the transistor 14, the transistor 56 corresponds to the transistor 13, the capacitor 57 corresponds to the capacitor 16, the capacitance 58 corresponds to the capacitance 17 and the current sink 59 corresponds to the current sink 18. Between the data input 52 of the amplifier 50 and the node 531 is connected a transistor 532, which can be controlled by the potential $V_{ref}$.

Whether data are input via the CCD input stage 40 into the CCD shift register, or whether the information present in the register 30 is regenerated can be decided by the control of the transistors 51 and 45. If the transistor 45 is switched on (potential $V_L$) and the transistor 51 is switched off (potential $V_S$), the information contained in the register 30 is regenerated. If, on the other hand, the transistors 45 and 51 possess the opposite states, data present at the data input 52 of the amplifier 50 are written into the CCD shift register via the input stage 40. The transistor 532 in the input amplifier 50 assumes the function of the voltage level converter. This is achieved in that the transistor 532 is connected to a reference voltage $V_{ref}$. If the input signal $U_S$ at the data input 52 has a voltage of $U_S > U_{ref} - U_T$, the biased capacitor 57 is not discharged, as a result of which the output 551 of the amplifier assumes a voltage of $V_B$. If, on the other hand, the data input 52 has a voltage of $U_S > U_{ref} - U_T$, the voltage across the biased capacitor 57 drops, as a result of which the output 551 retains the voltage of $V_{CC} - U_T$.

It will be apparent to those skilled in the art that many modifications and variations may be effected without departing from the spirit and scope of the novel concepts of the present invention.

I claim as my invention

1. A digital differential amplifier comprising a first voltage supply terminal and a second voltage supply terminal, an input terminal, an output terminal, a first transistor connected to said input terminal via a first terminal of its source-drain-channel, said first transistor having a gate terminal for connection to a first control potential terminal, a first capacitance connected between said input terminal and said first voltage supply terminal, a circuit node point, a second transistor connected between said circuit node point and said output terminal, said second transistor having a gate connected to said input terminal, a third transistor connected between said second voltage supply terminal and said circuit node point, said third transistor having a gate terminal for connection to a second control potential terminal, a fourth transistor connected between said second voltage supply terminal and said output terminal, said fourth transistor having its gate connected to said circuit node point, a second capacitance connected between said output terminal and said first voltage supply terminal, a third capacitance connected between said circuit node point and said first voltage supply terminal, a current sink connected between said output terminal and a third voltage supply terminal.

2. A digital differential amplifier according to claim 1 in which said first transistor has a second terminal of its source-drain-channel connected to said circuit node.

3. A digital differential amplifier according to claim 1 in which said first transistor has a second terminal of its source-drain-channel connected to said second voltage supply terminal.

4. A digital differential amplifier according to claim 1 having additionally a data input terminal and a fifth transistor connected between said data input terminal and said amplifier input point, said fifth transistor having its gate terminal connected to a clock pulse terminal.

5. A digital differential amplifier according to claim 1 in which said current sink includes a second circuit node, a fifth transistor connected between said output terminal and said third voltage supply terminal, having its gate input connected to said second circuit node; a sixth transistor connected between said second voltage supply terminal and said second circuit node having its gate input connected to said second voltage supply terminal; a seventh transistor having its gate input connected to said second circuit node and connected between said second circuit node and said third voltage supply terminal.

6. A digital differential amplifier according to claim 1 with said current sink comprising a second circuit node, a first transistor connected between said output terminal and said third voltage supply terminal, said fifth transistor having a gate input connected to said third voltage supply terminal; a sixth transistor connected between said output terminal and said first voltage supply terminal having its gate input connected to said second circuit node; a seventh transistor connected between said second voltage supply terminal and said second circuit node, said seventh transistor having its gate input connected to said second voltage terminal; an eighth transistor connected between said second circuit node and said first voltage supply terminal, said eighth transistor having its gate input connected to said second circuit node.

7. The method of using the CCD detection system as set forth in claim 1 to regenerate stored charges detected at the output of a first charge coupled device and transferring that regenerated charge to the input of a second charge coupled device which comprises:
pre-charging said first and second capacitances to said output voltage of said first voltage supply by turning on said first and second transistors with said first and second control voltages;
turning off said first transistor and turning on a first output gate terminal of said first charge coupled device and permitting the absence of charge at the output of said first charge coupled device to discharge said first capacitance;
turning off said third transistor because said charge is drained off of said first capacitance and turning off said second transistor permitting said second capacitance to hold on said fourth transistor resulting in output voltage continuing to appear at said output terminal and maintaining a charge on said third capacitance;
turning on a first input gate electrode of a second charge coupled device to detect the charge present on said third capacitance;
conversely, turning on a first output gate terminal of said first charge coupled device and permitting the presence of charge to not discharge said first capacitance;
holding on said third transistor because said charge on said first capacitance is not drained off and turning off said second transistor permitting said second capacitance to be discharged turning off said fourth transistor resulting in said third capacitance being discharged and a decline in voltage appearing at said output terminal; and
turning on a first input gate terminal of said second charge coupled device to detect the absence of charge on said third capacitance.

8. The method according to claim 7, wherein said second control voltage is a pulse voltage of minimal magnitude such that said second and fourth transistors properly conduct and said output voltage is properly detectable at said input gate terminal of said second charge coupled device.

9. A CCD detection system comprising a digital differential amplifier and two charge coupled devices for regenerating stored charges detected at the output of the first charge coupled device and transferring that regenerated charge to the input of a second charge coupled device, a digital differential amplifier comprising a first voltage supply terminal and a second voltage supply terminal, an input terminal, an output terminal, a first transistor connected to said input terminal via a first terminal of its source-drain-channel, said first transistor having a gate terminal for connection to a first control potential terminal, a first capacitance connected between said input terminal and said first voltage supply terminal, a circuit node point, a second transistor connected between said circuit node point and said output terminal, said second transistor having a gate connected to said input terminal, a third transistor connected between said second voltage supply terminal and said circuit node point, said third transistor having a gate terminal for connection to a second control potential terminal, a fourth transistor connected between said second voltage supply terminal and said output terminal, said fourth transistor having its gate connected to said circuit node point, a second capacitance connected between said output terminal and said first voltage supply terminal, a third capacitance connected between said circuit node point and said first voltage supply terminal, a current sink connected between said output terminal and a third voltage supply terminal, said input terminal to said digital differential amplifier being connected to an output terminal of a first charge coupled device and said output terminal of said differential amplifier being connected to an input terminal of a second charge coupled device.

10. The combination according to claim 9, wherein the transistors of said digital differential amplifier are field effect transistors and are constructed by an aluminum-silicon-gate technique, and wherein said charge coupled devices are constructed by an aluminum-silicon-gate technique.

11. The method of operating the CCD detection system according to claim 7 where the process of selecting a data recirculation mode or data entry mode comprises applying a third control potential to said third control potential terminal and simultaneously applying a fourth control potential to said fourth control potential terminal such that said fifth transistor conducts only when said seventh transistor is not permitted to conduct and said fifth transistor is not permitted to conduct when said seventh transistor is permitted to conduct.

12. A CCD detection system comprising the combination of two digital differential amplifiers and two charge coupled devices for regenerating stored charges detected at the output of a first charge coupled device and transferring that regenerated charge to the input of a second charge coupled device or alternately, producing a data output signal proportional to the stored charge detected at the output of a first charge coupled device and generating a charge proportional to a data input signal at the input to a second charge coupled device comprising a digital differential amplifier which includes a first voltage supply terminal and a second voltage supply terminal, an input terminal, an output terminal, a first transistor connected to said input terminal via a first terminal of its source-drain-channel, said first transistor having a gate terminal for connection to a first control potential terminal, a first capacitance connected between said input terminal and said first voltage supply terminal, a circuit node point, a second transistor connected between said circuit node point and said output terminal, said second transistor having a gate connected to said input terminal, a third transistor connected between said second voltage supply terminal and said circuit node point, said third transistor having a gate terminal for connection to a second control potential terminal, a fourth transistor connected between said second voltage supply terminal and said output terminal, said fourth transistor having its gate connected to said circuit node point, a second capacitance connected between said output terminal and said first voltage supply terminal, a third capacitance connected between said circuit node point and said first voltage supply terminal, a current sink connected between said output terminal and a third voltage supply terminal, having said input terminal connected to an output terminal of a first charge coupled device, a second circuit node, a fifth transistor connected between said second circuit node and the input terminal of a second charge coupled device, said fifth transistor having its gate input connected to a third control potential terminal, a second digital differential amplifier having a sixth transistor connected between said amplifier input terminal and a data input terminal, said sixth transistor having its gate input connected to a data control potential terminal; a seventh transistor connected between said output terminal of said second digital differential amplifier and said input terminal to said second charge coupled device, said seventh transistor having its gate input connected to a fourth control potential terminal.

13. The combination according to claim 12, wherein the transistors of said digital differential amplifiers are field effect transistors and are constructed by an aluminum-silicon-gate technique and wherein said charge coupled devices are constructed by an aluminum-silicon-gate technique.

14. The combination according to claim 12, wherein said first capacitance comprises the capacitance of the diffusion zone of said first output terminal of said first charge coupled device; wherein said third capacitance comprises the parasitic capacitance of said second transistor, the parasitic capacitance of said third transistor and the capacitance of said gate input of said fourth transistor; wherein said second capacitance comprises the parasitic capacitance of said second transistor and of said fourth transistor.

* * * * *